United States Patent [19]

Colville et al.

[11] 4,249,230
[45] Feb. 3, 1981

[54] PHOTOFLASH UNIT UTILIZING CIRCUIT BOARD HAVING FLASHLAMPS CLAMPED THERETO

[75] Inventors: William T. Colville; David W. Mecone; Donald W. Hartman, all of Williamsport, Pa.

[73] Assignee: GTE Products Corporation, Stamford, Conn.

[21] Appl. No.: 72,527

[22] Filed: Sep. 4, 1979

[51] Int. Cl.³ .............................................. F21K 5/02
[52] U.S. Cl. ..................................... 362/13; 362/237; 362/240; 362/241; 362/247; 431/358; 431/359; 431/365
[58] Field of Search ................... 362/13, 237, 238, 240, 362/241, 247, 346; 431/358, 359, 365

[56] References Cited

U.S. PATENT DOCUMENTS

| 3,327,105 | 6/1967 | Kottler et al. | 362/11 |
| 3,598,984 | 8/1971 | Slomski | 362/15 |
| 3,937,946 | 2/1976 | Weber | 362/14 |
| 3,959,860 | 6/1976 | Schindler | 29/25.16 |
| 4,028,798 | 6/1977 | Bechard et al. | 29/628 |
| 4,036,578 | 7/1977 | Herman | 362/13 |
| 4,059,389 | 11/1977 | Armstrong et al. | 362/13 |
| 4,096,549 | 6/1978 | Ander son et al. | 431/359 |
| 4,101,259 | 7/1978 | Shaffer et al. | 431/359 |
| 4,101,260 | 7/1978 | Wanninkhof et al. | 431/359 |

Primary Examiner—Benjamin R. Padgett
Assistant Examiner—Irwin Gluck
Attorney, Agent, or Firm—Lawrence R. Fraley

[57] ABSTRACT

A multilamp photoflash unit which includes an elongated housing, a circuit board located within a longitudinal channel within the housing, and several (e.g. six) electrically-activated flashlamps. The flashlamps utilize preformed lead-in wires which are clamped to peripheral side walls of the circuit board's insulative strip members to both secure the lamps in a linear orientation and to electrically connect portions of the lead-in wires to selected areas of the board's lamp-firing circuitry.

13 Claims, 5 Drawing Figures

PHOTOFLASH UNIT UTILIZING CIRCUIT BOARD HAVING FLASHLAMPS CLAMPED THERETO

TECHNICAL FIELD

The present invention relates to disposable multilamp photoflash units and particularly to those which are electrically activated.

Several varieties of electrically activated, multilamp photoflash units are available today for camera users. Among these are the popular "flashcube", the more recently introduced linear arrays known as "flash bars", and the vertically-oriented planar arrays commonly known as "flip-flash" devices. Examples of such units are illustrated in U.S. Pat. Nos. 3,327,105 (Kottler et al), 3,598,984 (Slomski), and 3,937,946 (Weber), respectively. As described therein, these units readily attach (e.g. by insertion within) to many of today's modern cameras and are activated by a suitable pulse provided by the camera's power source. The amount of energy required to accomplish this activation is dependent on the type of flashlamp utilized in the unit. In the industry, these are typically classified into two varieties: low-voltage and high-voltage. Low-voltage photoflash lamps typically include a glass envelope with a combustion-supporting gas (e.g. oxygen) and a quantity of filamentary, combustible material (e.g. shredded zirconium or hafnium) therein. A pair of electrically conductive lead-in wires are usually sealed in one end of the envelope and extend therein. A filament wire is utilized and interconnects the extending ends of the lead-in wires. When the filament is heated by a firing current usually generated from a low-voltage source such as battery or charged capacitor (e.g. having a voltage of from about 1.5 to 15 volts), it ignites a primer material which then ignites the combustible material to produce a flash of light. Naturally, the oxygen gas aids in the above ignition.

High voltage photoflash lamps usually employ one of two ignition structures, both exclusive of the aforedescribed filament. In one embodiment, a glass or ceramic bead is located within the envelope and contains extending ends of the lamp's conductive lead-in wires therein. A quantity of primer material occupies a surface of the bead and bridges the portions of the extending ends which project through the bead. Flashing of the lamp is achieved by application of a firing pulse approaching a few thousand volts across the portions of the lead-in wires which protrude from the envelope. The ignited primer material in turn ignites the combustible, filamentary zirconium material also used in lamps of this variety. An example of such a lamp is illustrated in U.S. Pat. No. 3,959,860 (Schindler). In another embodiment, the glass bead is excluded with the primer material being directly applied to spaced-apart, spherical terminations of the lead-in wires' extending ends. Ignition is achieved in a similar manner to that of the above beaded lamp, by application of a high voltage pulse across the two projecting lead-in wires. A spark discharge occurs between the two separate primer masses causing deflagration thereof and subsequent ignition of the adjacent zirconium or hafnium material. An example of a lamp utilizing such an ignition structure is illustrated in U.S. Pat. No. 4,059,389 (Armstrong et al). In yet another type of high voltage lamp, end portions of the lead-in wires are positioned on opposing sides of an indentation formed within the lamp's sealed end (bottom) portion with the primer material located within the indentation and interconnecting the two. Here also, combustible filamentary material is used and is ignited by the deflagrating primer. The teachings of the instant invention are particularly concerned with high voltage lamps, although it will be understood from the following that said teachings may be readily extended to lamps of the earlier generation, low voltage variety.

BACKGROUND

In the more recent multilamp units such as the "flip-flash" devices, it has become common practice to utilize a printed circuit board (PCB) and to connect the lead-in wires from the unit's flashlamps to lamp-firing circuitry located on one of the PCB's surfaces. Heretofore, these connections have been accomplished primarily by using one of three methods. A first involves simply soldering the ends of the lead-in wires to the respective circuit paths or terminals. Understandably, this method requires added material as well as precisioned alignment between wires and terminals immediately prior to connection. A second technique involves use of added conductive components such as eyelets, rivets, etc. which are inserted in holes in the PCB and the lead-in wires inserted therein. After insertion, the eyelets are crimped and bent to the desired configuration. An example of this method is described in U.S. Pat. No. 4,036,578 (Herman). This method has also proven disadvantageous due to the need for the described added parts as well as the requirement for precise eyelet and lead-in wire alignment during eyelet positioning and crimping, respectively. Understandably, these latter steps are also time-consuming and thus not readily adaptable to an industry which demands high production rates.

As described in U.S. Pat. No. 4,028,798 (Bechard et al), a third technique for connecting lead-in wires to circuitry on a PCB has been to embed the wires within the PCB's substrate such that portions thereof physically contact the circuitry either on a bottom surface or by impression across an upper (top) surface. One problem of such a method has been the ready possibility of faulty connections due primarily to inadequate substrate deformation. Such a technique fails to readily lend itself to manufacture of a miniaturized, final product because of the need for relatively large spaces on the substrate for securement of each lamp.

It is believed therefore that a multilamp photoflash unit which provides for sound, effective connection between the unit's PCB circuitry and lamp lead-in wires without the several disadvantages cited above would constitute a significant advancement in the art. As will be described, an added feature of the connection means of the instant invention is the positive securement and alignment of the unit's lamps in relation to the PCB component.

DISCLOSURE OF THE INVENTION

It is a primary object of the present invention to provide an electrically-activated multilamp photoflash unit which assures sound connection between the unit's lamps and PCB circuitry without the need for added items or material such as solder, eyelets, rivets, etc. and the problems associated therewith.

It is another object of the invention to provide such a unit which can be readily and economically produced.

Still another object of the invention is to provide a unit of the type described which is both compact in design and relatively simple to operate.

These objects are accomplished in one aspect of the invention by provision of a multilamp photoflash unit which comprises a circuit board including an insulative strip with lamp-firing circuitry located on one surface thereof. The unit's lamps are connected to this circuitry by clamping the lead-in wires about peripheral sidewalls of the insulative strip. This clamping arrangment not only assures adequate connection between wires and circuitry but also positive, aligned securement of the lamps to the strip.

BEST MODE FOR CARRYING OUT THE INVENTION

For a better understanding of the present invention together with other and further objects, advantages and capabilities thereof, reference is made to the following disclosure and appended claims in connection with the above-described drawings.

Figures 1, 2:
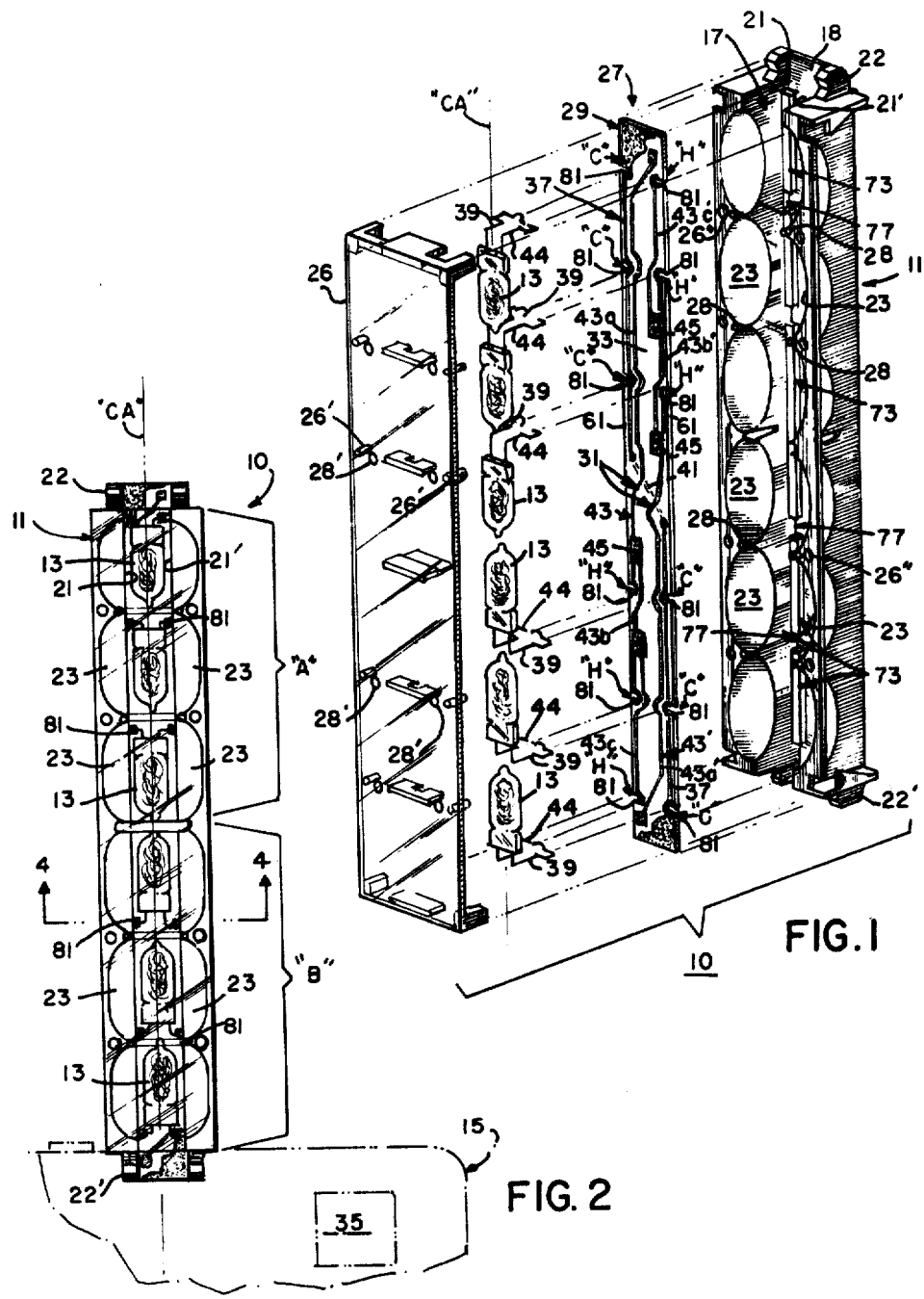
FIG. 1 is an exploded isometric view of a multilamp photoflash unit in accordance with a preferred embodiment of the invention.
FIG. 2 is a front elevational view of the unit of FIG. 1, as assembled, showing the unit in position on a camera.

With particular reference to both FIGS. 1 and 2, there is shown a multilamp photoflash unit 10 in accordance with a preferred embodiment of the invention. Unit 10 comprises an elongated housing 11 which defines therein first and second separate regions "A" and "B", respectively, each adapted for having a plurality of electrically-activated flashlamps 13 positioned therein. As shown in the drawings, each plurality includes three lamps although it is understood that this number can vary. For example, another embodiment of the invention included two lamps in each region. Unit 10 as illustrated thus includes a total of six lamps 13 available to the operator thereof when the invention is used with a respective camera 15 (shown in phantom in FIG. 2). Camera 15 may comprise any camera including a suitable socket for having unit 10 located therein and a power source associated therewith capable of providing a pulse sufficient to activate each lamp 13. Preferred examples include today's popular "pocket" cameras produced by Eastman Kodak, Rochester, New York. The power source typically associated with such cameras is a piezoelectric element (not shown) located within the camera and electrically joined to the socket. Accordingly, a pulse approaching several (e.g. five) thousand volts is supplied the socket, and therefore unit 10, when the camera operator depresses the camera's picture-taking lever or button. Understandably, this firing pulse is applied in synchronism with opening of the camera's shutter whereby the instantaneous, bright flash from the activated flashlamp can serve to illuminate the desired subject field.

Figure 4:
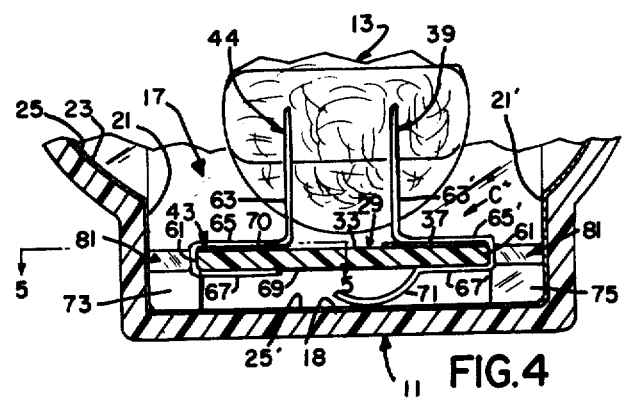
FIG. 4 is an enlarged, partial view, in section, of the invention as taken along the line 4—4 in FIG. 2.

Housing 11 includes a longitudinal channel 17 which runs the full length of the housing and is centrally located therein. As illustrated, channel 17 is defined by a rear wall 18 (see also FIG. 4) and a pair of opposing, upstanding side walls 21 and 21' which adjoin rear wall 18. Secured to or forming a part of opposing ends of housing 11 are two mounting devices 22 and 22' which are each adapted for being inserted within the corresponding socket of camera 15 to assure stable orientation of unit 10 atop the camera. As shown, channel 17 extends through each mounting device. Located along opposing upstanding side walls 21 and 21' within housing 11 are a plurality of recesses 23 which combine in the paired relationships illustrated to accomodate lamps 13. As illustrated, each pair (two) of recesses align with a respective lamp in the finished product to thus serve as a reflector therefor. That is, each pair combine to form a parabolic reflector cavity. Accordingly, the surfaces of each recess are preferably coated with a suitable reflective material (e.g. aluminum) to enhance light output from the lamp located adjacent thereto. This coating is illustrated as numeral 25 in FIGS. 4 and 5. Unit 10 also includes a substantially planar light-transmitting panel 26 which secures to housing 11 to cover the unit's lamps 13. The light emitted from lamps 13 will thus pass through panel 26. Panel alignment and attachment to housing 11 is facilitated by utilization of a plurality of pins 26' which project from the panel and insert within corresponding apertures 26" within the housing. Attachment is also enchanced by provision of several upstanding projections 28 on housing 11 which mate with corresponding openings 28' in the panel. In the event that it is desired to provide coating 25 on projections 28 and the surfaces adjoining these components, the projections will aid in preventing accidental electrostatic ignition of lamps 13.

Unit 10 comprises a circuit board 27 for transmitting the aforedescribed lamp-firing pulses from the camera's piezoelectric unit to the lamps 13 designated for firing. In the instant invention, circuit board 27 comprises an elongated, electrically insulative strip member 29 adapted for being snugly positioned within channel 17 of housing 11. Ends of strip 29 extend into mounting devices 22 and 22' such that when pulses are applied thereto, these pulses will be transmitted up the board's lamp-firing circuitry 31 (located on an upper, planar surface 33 of strip 29) to the desired lamps. One of the primary functions of unit 10 is to substantially prevent the deleterious photographic condition referred to as "red-eye". "Red-eye" is light from the camera's flash unit entering the subject's pupils and illuminating the retinas in the eyes at regions approximately in line with the optical axis of the camera's lens. In other words, "red-eye" most usually occurs when the source of light used with the camera is too close to the camera's lens. Unit 10 substantially prevents this occurrence by locating lamps 13 a sufficient distance from the camera's lens 35 during firing thereof. That is, only the lamps in region "A" are flashed when unit 10 is located atop camera 15 with mounting device 22' inserted within the camera's socket. Similarly, only the lamps in region "B" are flashed when the unit is inverted and device 22 is inserted within the socket. In other words, first mounting device 22 is separated from the lamps in region "A" by the length of region "B", both of said lengths the approximate distance to substantially prevent "red-eye".

The lamp-firing circuitry 31 of board 27 which assures the above described mode of operation can be defined as including three separate circuit paths. First, a single common path 37 is connected to one lead-in wire 39 of each lamp at designated locations ("C"). These locations are somewhat enlarged in comparison to the narrow-width circuit paths connecting said locations to facilitate connection of the leads thereto. Common path 37 is divided into two portions on surface 33 with each portion connecting only a single lead 39 from a respective plurality of lamps. The ends of these portions terminate on surface 33 at the appropriate center of board 27 and are connected by a common circuit "jumper" 41 in the form of a bent metal wire which passes along the back of the board (on the surface opposite surface 33). Ends of "jumper" 41 preferably penetrate the board to effect this connection.

Circuitry 31 further includes two "hot" circuit paths 43 and 43'. Path 43 passes from the upper portion of strip 29 in the orientation of FIG. 1 downward to electrically connect the lead-in wires 44 of the lamps in region "B" (at locations "H"). As shown, path 43 is comprised of three segments 43a, 43b, and 43c. Segments 43a and 43b are connected by a radiation switch 45 which may be of any suitable material having initially an open circuit or high resistance. Upon receipt of radiation in the form of light and/or heat from an adjacent flashlamp 13, the resistance of this material becomes substantially zero or of a very low value. A suitable material for switch 45 is silver oxide dispersed in a polyvinyl resin binder. Segments 43b and 43c of path 43 are similarly connected by a second switch 45. As shown, a switch is therefore located adjacent the first two lamps to be fired in region "B". Understandably, the function of each switch is to electrically connect the next lamp to be fired once this switch receives the described radiation. A switch possessing the above capabilities is understandably not required adjacent the last lamp (bottom lamp in FIGS. 1, 2) to be activated.

Path 43' operates in a similar manner to 43 to electrically connect the lead-in wires 44 of the lamps in region "A". Accordingly, path 43' passes from the bottom of strip 29 in the orientation depicted in FIGS. 1 and 2 upwardly to the respective locations ("H") shown to effect this connection. Path 43' therefore also includes three segments 43a', 43b', and 43c' interconnected by two radiation switches 45. Because path 43'functions similarly to path 43, further description is not believed necessary.

Operation of unit 10 further involves inserting one of the mounting devices 22 or 22' into the socket of camera 15. Assuming unit 10 is oriented as shown in FIG. 2 (with device 22' electrically connected to the camera's power source), the initial firing pulse from the power source will be directly applied to the first lamp in region "A" to effect ignition thereof. From the above description of circuitry 31, it is understood that this first lamp is the lower lamp of the three in the orientation depicted in FIGS. 1 and 2. Flashing of this lamp causes the adjacent radiation switch 45 to reach zero or very low resistance and thus connect the next (adjacent) lamp into the firing circuit for directly receiving the next pulse. Ignition of this lamp in turn causes the switch adjacent thereto to become conductive and connect the final (uppermost) lamp for flashing. Operation of the invention with regard to ignition of the lamps of region "B" is identical to that for the lamps of region "A" with the exception, of course, that the unit is inverted and device 22 inserted within the camera's socket. Added description of this operation is therefore not believed necessary.

Figure 3:
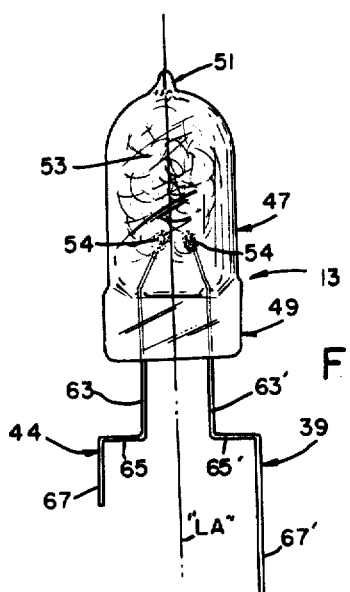
FIG. 3 is an elevational view of a flashlamp for use in the unit of FIG. 1, illustrating the desired, preformed configuration of the lamp's lead-in wires prior to connection and securement to the unit's strip member.

It can be understood from the foregoing that it is highly desirable that the first two lamps in each region must form an open circuit upon flashing thereof. Otherwise, said lamps can short-circuit the remaining, unfired lamps and prevent ignition thereof. Unit 10 assures this important open circuit feature by orienting lamps 13 in housing 11 such that each lamp wil be inverted during flashing thereof when unit 10 is substantially vertically positioned atop camera 15. Positioning photoflash units designed to prevent "red-eye" atop the camera in a vertical orientation represents the most preferred manner of operating such devices today. This new positioning relationship between lamp and camera during ignition not only prevents short circuits in flashed lamps but also results in an increase in total light output from each lamp in comparison to lamps fired in an upright manner. By the term inverted is meant that one end of the lamp containing the conductive lead-in wires faces upwardly during lamp ignition. In the case of unit 10, this means that these ends face away from both the mounting device connected to camera 15 and the region of lamps not being fired (those closest to the camera). The lamps 13 of unit 10, as shown in FIG. 3, each include a hermetically sealed, light-transmitting envelope 47 of glass (e.g. borosilicate) tubing having a press-sealed end portion 49 containing lead-in wires 39 and 44 therein. Lamp 13 also includes a top portion 51 at an opposing end to sealed end 49. Ends 49 and 51 are formed using techniques well known in the industry and further description is not believed necessary. Envelope 47 preferably has a length of about 0.50 inch and an internal volume of less than one cubic centimeter. A quantity of filamentary combustible material 53, such as shredded zirconium or hafnium foil, is disposed within envelope 47. Also within the envelope is a fill of combustion-supporting gas, such as oxygen, established at a pressure of several atmospheres. The exterior surface of envelope 47 is also provided with a protective coating such as cellulose acetate (not shown). The lamp's lead-in wires form part of the lamp's ignition structure. A remaining part includes a coating of primer material 54 over portions of each end of the lead-in wires which extend within envelope 47. As shown, these ends, including primer 54 thereon, are spaced apart in the finished product. The preferred spacing should be a minimum of about 0.040 inch so that if no lead wire meltback occurs during flashing, the gap between the lead ends is sufficient to prevent subsequent high voltage arc over. If the leads melt back partially or completely, as often results, the meltback follows the illustrated sloped configuration of FIG. 3, thus increasing the gap between the internal leads. Operation of lamp 13 involves impressing a high voltage pulse (from the camera's piezoelectric crystal) across lead-in wires 39 and 44 to cause electrical breakdown of primer 54 and generation of a spark therebetween. Primer ignition causes deflagration thereof and instantaneous ignition of material 53. The result is a highly intense flash of light capable of sufficiently illuminating a subject field in front of camera 15.

Short circuiting by lamp 13 on strip 29, when fired in the inverted manner shown, is prevented due to the gravitational influence on unburned droplets of material 53. In almost all lamp firing situations, such droplets occur and are readily capable of physically contacting and bridging the remaining end portions of lead-in wires 39 and 44 which extend within envelope 47. Unit 10 eliminates this possibility in that unburned droplets are forced to fall to the lower tip portion 51 of envelope 47 where they cool and solidify almost instantly.

As illustrated in the drawings, flashlamps 13 of unit 10 are oriented in a linear array such that the longitudinal axes ("LA" in lamp 13 of FIG. 3) of all lamps occupy a common axis "CA" (FIGS. 1, 2). Each axis "LA" is also parallel to the planar upper surface 33 of strip 29. This arrangement assures both compactness and miniaturization for unit 10. For example, the six-lamp unit of FIG. 1 as assembled possesses an overall height of only about 5.57 inches, a width of only about 0.85 inch, and a thickness (depth) of only about 0.70 inch. A four-lamp embodiment, designed to accomodate somewhat larger lamps than those of unit 10, possesses substantially similar dimensions. The lamps described above and shown in FIG. 3 possess an average peak output of about 1250 beam candlepower seconds with a peaking time of about 8 milliseconds.

In accordance with the invention, a new and unique means of connecting lamps 13 to circuit board 27 is utilized. In summary, the lead-in wires 39 and 44 of each lamp 13 are clamped about a respective one of two, opposing peripheral side walls 61 of strip member 29 in such a manner so as to both connect the wires to the aforedescribed lamp-firing circuit paths and to secure the lamps in the orientation shown. Lamps 13 are thus fixedly retained in a secured and aligned manner without the need for soldering or added components such as eyelets, rivets, etc.

Figure 5:
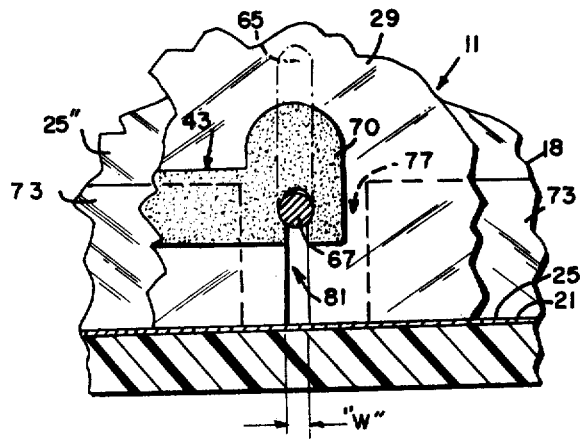
FIG. 5 is an enlarged, partial view, partly in section, as taken along the line 5—5 in FIG. 4.

Clamping is accomplished by first preforming leads 39 and 44 in the configurations illustrated in FIG. 3. Lead-in wire 44 is preferably shorter than wire 39 (for reasons defined below) and includes three linear portions 63, 65, and 67. First portion 63 projects from envelope 47, portion 65 is bent at an angle of about 90 degrees to portion 63 and comprises the portion of wire 44 designed to be electrically connected to a respective circuit path (FIGS. 4, 5), and end portion 67 is bent at about 90 degrees to portion 65. Portion 67 is eventually bent at its approximate mid-point during the clamping of lamp 13 to strip 29 to define the final configuration shown in FIG. 4. As illustrated therein, the end part of portion 67 is thus parallel to the middle portion 65 and serves to positively engage the bottom surface 69 of strip 29. Portion 65 serves to physically engage the designated circuit path (43) at an enlarged, connective pad portion 70 thereof. This orientation is best illustrated in FIG. 5, wherein portion 65 is shown in phantom. Approximately the entire length of portion 65 engages pad portion 70 to assure a positive electrical connection therebetween.

Lead-in wire 39 is formed in a similar manner to wire 44 prior to clamping and thus includes three portions 63', 65', 67' (FIG. 3). Middle portions 65' serves to engage common circuit path 37 in the clamped configuration shown in FIG. 4 while end portion 67' engages the bottom surface 69 of strip 29.

Clamping of wires 39 and 44 is facilitated by utilization of a material for strip member 29 which permits partial deformation thereof by the wires during the clamping operation. That is, portions 65 and 65' and portions 67 and 67' partially embed within the upper and lower surfaces of member 29 during the clamping procedure. Understandably, the parts of circuitry located under portions 65 and 65' will also partially embed. Upon removal of the clamping jaws (not shown), partial springback of each wire may occur until the wires assume the positions shown in FIG. 4. A preferred material for member 29 is high or medium impact polystyrene.

It is preferred in the instant invention to provide an electrically conductive reflective coating 25' (e.g. aluminum) on rear wall 18 of housing 11 to enhance the light output from lamps 13 and to provide a conductive "shield" adjacent circuit board 27 for substantially preventing accidental lamp ignition by electrostatic charges. As a "shield", coating 25' increases the stray capacitance to surrounding spaces so that electrostatic charges applied to unit 10 dissipate into these spaces instead of through one or more of lamps 13. Coating 25' is preferably the same as that utilized in recesses 23 and is preferably continuous in nature so as to cover both side walls 21 and 21'. Common circuit path 37 is grounded to coating 25' by a curvilinear end portion 71 of lead-in wire 39, which extends from portion 67' to physically contact the coating and form a spring-type engagement in the finished product. A spring-type connection assures both positive grounding and good electrostatic discharge protection.

Because coating 25' is conductive, it is important to space circuit board 27 from rear wall 18 to prevent contact between clamped ends 67 of wires 44 and this coating, which in effect would render unit 10 inoperable. The preferred spacing means in the present invention comprises at least two, spaced longitudinal ledges 73 and 75 located in channel 17 relative to rear wall 18 and side walls 21 and 21'. By relative is meant that each ledge may be secured to or form part of rear wall 18 and/or an adjoining side wall. In the preferred arrangement, two pluralities of ledges are used with each plurality including five members arranged in a linear pattern. One plurality arranged in such a manner, is shown in FIG. 1. It is understood that a similar plurality (hidden) is also used in the embodiment of FIG. 1 along the opposite side of channel 17.

Strip 29 rests on the provided ledges in the finished product to assure the spacing desired. In the event that the ledges are also covered with a conductive, reflective coating 25, spaces 77 (FIGS. 1, 5) are provided between each ledge in the linear plurality such that the clamped lead-in wires are aligned therein and prevented from contacting said coating. It is preferred to provide such spaces even for the grounding lead-in wires 39 although it is understood that these wires could physically engage the coated ledge and satisfactorily perform the desired function. It is also within the scope, of the invention to connect wires 39 to the coating located on one of the side walls 21 or 21' in the event a coating is employed thereon. It is even further within the scope of the invention to use only two, continuous ledge members 73 and 75 rather than two spaced pluralities of such members. In such an event, only preselected portions of the ledges would be coated to assure prevention of lead-in wire-coating contact. This could be assured by masking the regions of the ledges (and adjacent regions of side walls 21, 21' if desired) to which contact is not to occur.

As an alternative embodiment, circuit board 27 could be spaced from rear wall 18 using a plurality of transverse ribs (not shown) which are laterally oriented within channel 17 at designated spacings and adapted for having strip 29 seated thereon.

Attachment of lamps 13 to circuit board 27 is enhanced by provision of a plurality (six) of notches 81 within each of the opposing peripheral side walls 61 of strip 29. As shown in FIG. 5, each notch 81 accommodates a part of one portion (67) of a respective lead-in wire (44). It is understood that wires 39 are similarly retained. Wire securement is further assured by providing a frictional engagement between wire diameters which are greater than the width ("W") of each notch. This form of engagement, resulting in slight deformation to these surfaces, also assures positive contact between the wire and circuit path 43, which runs to the upper, extreme edges of notch 81. As stated above, strip member 29 is of a deformable material and, therefore, permits such engagement. Other preferred materials for use in unit 10 are: lamp-firing circuitry 31, aluminum; housing 11, polystyrene; and light-transmitting cover 26, butadiene styrene thermoplastic. The preferred materials for lamps 13 have been defined.

Thus there has been shown and described a multilamp photoflash unit which utilizes a new and unique means of securing and electrically connecting the unit's flashlamps to a corresponding circuit board. The invention as defined is also understandably cheaper to produce and more readily capable of being manufactured at high production rates than the aforedescribed prior art units.

While there have been shown and described what are at present considered the preferred embodiments of the invention, it will be obvious to those skilled in the art that various changes and modifications may be made therein without departing from the scope of the invention as defined by the appended claims. For example, the invention in its simplest form, can comprise only a circuit board and lamp components with minor modification to the board's strip member to provide proper seating upon the respective camera. As such, the strip could include formed sides or similar structure to serve as a housing for the finished unit.

What is claimed is:

1. A multilamp photoflash unit comprising:
   a circuit board including an electrically insulative strip member and lamp-firing circuitry located on a first surface of said strip member, said strip member including at least two peripheral side walls; and
   a plurality of electrically-activated flashlamps, each of said flashlamps including a light-transmitting envelope and a pair of electrically conductive lead-in wires projecting from said envelope, each of said lead-in wires clamped about a respective one of said peripheral side walls of said strip member to secure said flashlamps to said strip member and electrically connect said flashlamps to said lamp-firing circuitry located on said first surface.

2. The photoflash unit according to claim 1 further including an elongated insulative housing having a rear wall and two opposing side walls adjoining said rear wall, said rear and side walls defining a longitudinal channel within said housing, said circuit board located within said channel.

3. The photoflash unit according to claim 2 further including a light-transmitting cover secured to said housing for covering said flashlamps.

4. The photoflash unit according to claim 2 wherein said rear wall includes an electrically conductive reflective coating thereon, said elongated housing including means for spacing said circuit board from said rear wall.

5. The photoflash unit according to claim 4 wherein one of said lead-in wires from each of said flashlamps includes a curvilinear end portion, said curvilinear end portion physically contacting said conductive reflective coating on said rear wall.

6. The photoflash unit according to claim 4 wherein said means for spacing said circuit board from said rear wall comprises at least two longitudinal ledges positioned within said channel relative to said rear wall, said strip member located on said longitudinal ledges.

7. The photoflash unit according to claim 6 wherein preselected portions of said longitudinal ledges include an electrically conductive reflective coating thereon, said strip member located on said ledges such that said lead-in wires clamped about said strip member do not physically contact said preselected portions.

8. The photoflash unit according to claim 4 wherein said means for spacing said circuit board from said rear wall comprises first and second pluralities of spaced, longitudinal ledges, each of said pluralities of ledges oriented in a substantially linear manner within said channel relative to said rear wall, said strip member located on said ledges.

9. The photoflash unit according to claim 8 wherein said ledges include an electrically conductive reflective coating thereon, said strip member located on said ledges such that said lead-in wires clamped about said strip member are aligned within the spaces between said ledges.

10. The photoflash unit according to claim 1 wherein each of said peripheral side walls of said strip member include a plurality of notches therein, a portion of each of said lead-in wires located within a respective one of said notches.

11. The photoflash unit according to claim 10 wherein said portions of said lead-in wires located within said notches are frictionally positioned therein.

12. The photoflash unit according to claim 1 wherein said flashlamps are secured to said strip member in a substantially linear pattern.

13. The photoflash unit according to claim 1 wherein said strip member is comprised of a deformable material to permit partial deformation thereof by said lead-in wires during clamping of said lead in wires.

* * * * *